United States Patent
Wang et al.

(10) Patent No.: US 10,622,030 B1
(45) Date of Patent: Apr. 14, 2020

(54) MEMORY STRUCTURE WITH NON-STRAIGHT WORD LINE

(71) Applicant: NANYA TECHNOLOGY CORPORATION, New Taipei (TW)

(72) Inventors: Wei-Chih Wang, Taoyuan (TW); Tseng-Fu Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/172,853

(22) Filed: Oct. 28, 2018

(51) Int. Cl.
  *G11C 11/34* (2006.01)
  *G11C 5/06* (2006.01)
  *G11C 11/4097* (2006.01)

(52) U.S. Cl.
  CPC .......... *G11C 5/063* (2013.01); *G11C 11/4097* (2013.01)

(58) Field of Classification Search
  CPC ............................ G11C 5/063; G11C 11/4097
  USPC ......................................................... 365/174
  See application file for complete search history.

(56) References Cited

U.S. PATENT DOCUMENTS

| | | | | |
|---|---|---|---|---|
| 4,839,705 A * | 6/1989 | Tigelaar | ............... | H01L 27/115 365/185.16 |
| 5,661,061 A * | 8/1997 | Usuami | ............. | H01L 27/10852 438/254 |
| 6,043,562 A * | 3/2000 | Keeth | ...................... | G11C 7/18 257/210 |
| 6,069,383 A * | 5/2000 | Yu | ........................ | H01L 27/115 257/316 |
| 6,194,767 B1 * | 2/2001 | An | ..................... | G11C 16/0491 257/390 |

FOREIGN PATENT DOCUMENTS

| TW | 393731 B | 6/2000 |
|---|---|---|
| TW | I278100 B | 4/2007 |

* cited by examiner

*Primary Examiner* — Tha-O H Bui
(74) *Attorney, Agent, or Firm* — CKC & Partners Co., LLC

(57) ABSTRACT

A memory structure includes a first memory cell, a first word line and a second word line. The first word line includes a first portion, a second portion and a third portion. The first portion extends from an end of the second portion along a first direction, and the third portion extends from an another end of the second portion along a second direction. An angle between the first direction and the second direction is less than 180°. The second word line includes a forth portion, a fifth portion and a sixth portion. The forth portion extends from an end of the fifth portion along a third direction, and the sixth portion extends from an another end of the fifth portion along a forth direction. An angle between the third direction and the forth direction is less than 180°.

15 Claims, 5 Drawing Sheets

MEMORY STRUCTURE WITH NON-STRAIGHT WORD LINE

BACKGROUND

Field of Invention

The present invention relates to dynamic random-access memories.

Description of Related Art

There are two major types of random-access memory devices, i.e., dynamic memories and static memories. The dynamic random access memory (DRAM) has become one of the most important integrated circuit devices. Dynamic random-access memories (DRAMs) can be programmed to store a voltage which represents a binary value, but require periodic reprogramming or "refreshing" to maintain this voltage for a very short time period. In order to increase the performance of the DRAM, it is important to improve the on current and the gate induced drain leakage (GIDL).

SUMMARY

The invention provides a memory structure, which includes a first memory cell, a first word line and a second word line. The first word line is disposed on the first memory cell, in which the first word line includes a first portion, a second portion and a third portion. The first portion extends from an end of the second portion along a first direction, and the third portion extends from an another end of the second portion along a second direction. An angle between the first direction and the second direction is less than 180°. The second word line is disposed on the first memory cell, in which the second word line includes a forth portion, a fifth portion and a sixth portion. The forth portion extends from an end of the fifth portion along a third direction, and the sixth portion extends from an another end of the fifth portion along a forth direction. An angle between the third direction and the forth direction is less than 180°. A distance between the second portion and the fifth portion is less than a distance between the first portion and the forth portion and a distance between the third portion and the sixth portion.

According to an aspect of the present invention, the memory structure further comprises a second memory cell, in which the third portion extends to the second memory cell and a part of the third portion is disposed on the second memory cell.

According to an aspect of the present invention, the memory structure further comprises a third memory cell, in which the sixth portion extends to the third memory cell and a part of the sixth portion is disposed on the third memory cell.

According to an aspect of the present invention, the first memory cell comprises a first cell region, a second cell region and a digit region disposed between the cell regions.

According to an aspect of the present invention, the memory structure further comprises a first capacitor disposed at the first cell region and a second capacitor disposed at the second cell region.

According to an aspect of the present invention, the memory structure further comprises a bit line extending through the first memory cell.

According to an aspect of the present invention, the memory structure further comprises a bit line contact disposed at the digit region of the first memory cell and electrically connected with the bit line.

According to an aspect of the present invention, the digit region and the first cell region are separated by the first word line, and the digit region and the second cell region are separated by the second word line.

According to an aspect of the present invention, the distance between the second portion and the fifth portion is 5-50 nm.

According to an aspect of the present invention, a bending point of the first word line and a bending point of the second word line are disposed in the first memory cell.

According to an aspect of the present invention, a width of the first word line or the second word line is 5-50 nm.

The invention also provides a memory structure, which includes a first memory cell, a first curved word line and a second curved word line. The first memory cell has a principle surface. The first curved word line is disposed on the first memory cell, and the first curved word line includes a first turning point. The second curved word line is disposed on the first memory cell, and the second curved word line includes a second turning point, in which a minimal spacing between the first curved word line and the second curved word line is present between the first turning point and the second turning point. Both the first turning point and the second turning point are aligned with the first memory cell in a direction perpendicular to the principle surface.

According to an aspect of the present invention, the first and the second turning portions are disposed in the first memory cell.

According to an aspect of the present invention, the memory structure further comprises a second memory cell, wherein the first curved word line extends to the second memory cell and a part of the first curved word line is disposed on the second memory cell.

According to an aspect of the present invention, the first curved word line has a third turning point disposed at the second memory cell.

According to an aspect of the present invention, the memory structure further comprises a third memory cell, wherein the second curved word line extends to the third memory cell and a part of the second curved word line is disposed on the third memory cell.

According to an aspect of the present invention, the first memory cell comprises a first cell region, a second cell region and a digit region between the first and second cell regions.

According to an aspect of the present invention, the memory structure further comprises a first capacitor disposed in the first cell region and a second capacitor disposed in the second cell region.

According to an aspect of the present invention, the memory structure further comprises a bit line, in which the bit line extends through the first memory cell.

According to an aspect of the present invention, the memory structure further comprises a bit line contact disposed in the digit region and electrically connected with the bit line.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
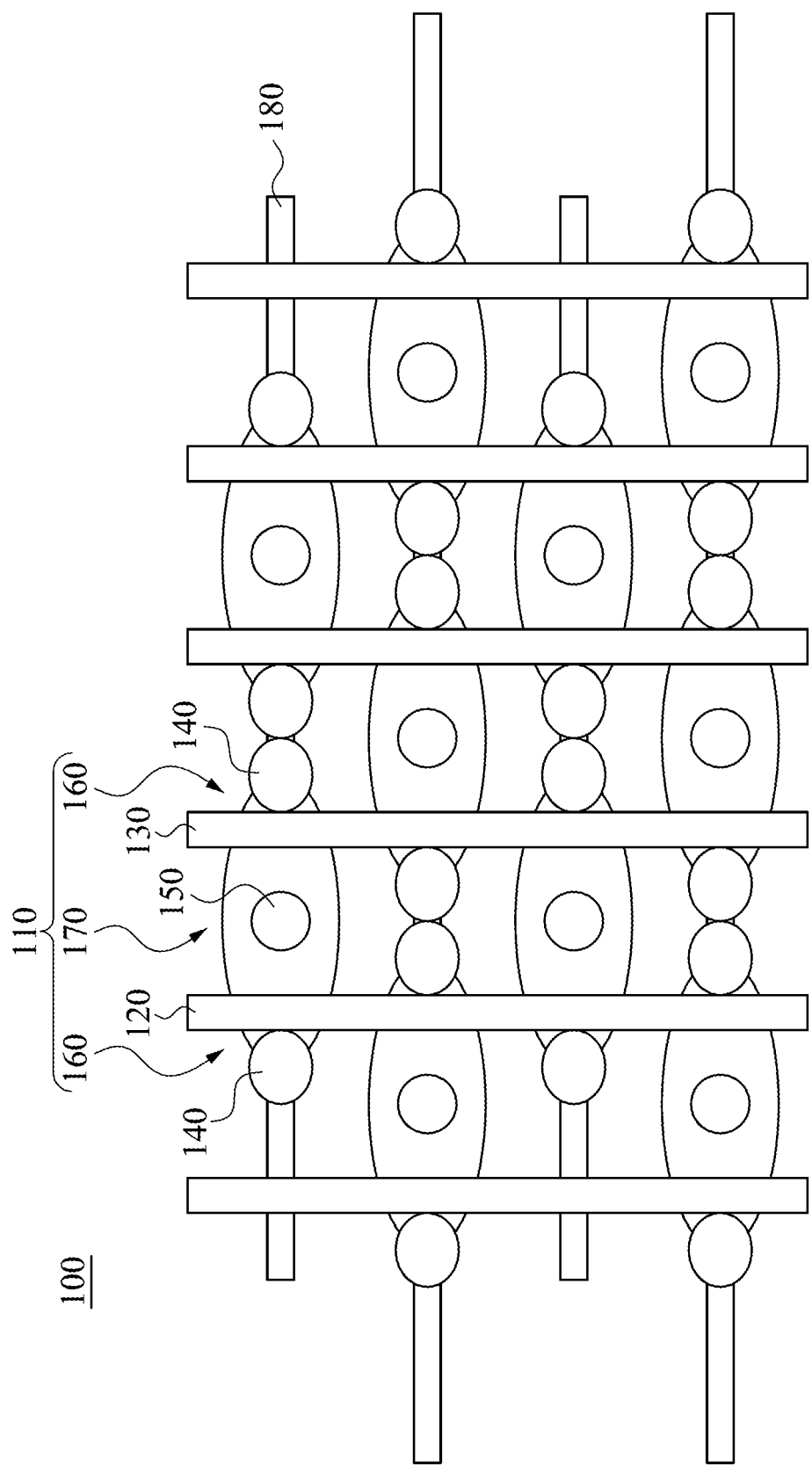
FIG. 1 illustrates a top view of a memory structure 100 according a comparative example of the present invention.

Reference will now be made in detail to the present embodiments of the invention, examples of which are illustrated in the accompanying drawings. Wherever possible, the same reference numbers are used in the drawings and the description to refer to the same or like parts.

The present invention provides a memory structure with a new type of word lines. Moreover, the memory structure of the present invention enhances the "on current" and improves the gate induced drain leakage (GIDL).

FIG. 1 illustrates a top view of a memory structure 100 according a comparative example of the present invention. The memory structure 100 includes a first memory cell 110, a first word line 120, a second word line 130, capacitors 140 and a bit line contact 150. For the purpose of simplicity, FIG. 1 merely illustrates a part of the memory structure 100. In some embodiments, the memory structure 100 further includes a bit line 180. The bit line is electrically connected to the bit line contact 150, and extends through the first memory cell 110.

The first memory cell 110 includes two cell regions 160 and a digit region 170 disposed between the two cell regions 160. The capacitors 140 are disposed at the cell regions 160, and the bit line contact 150 is disposed at the digit region 170. It is noted that both the first word line 120 and the second word line 130 are substantially straight in the memory structure 100.

Figure 2:
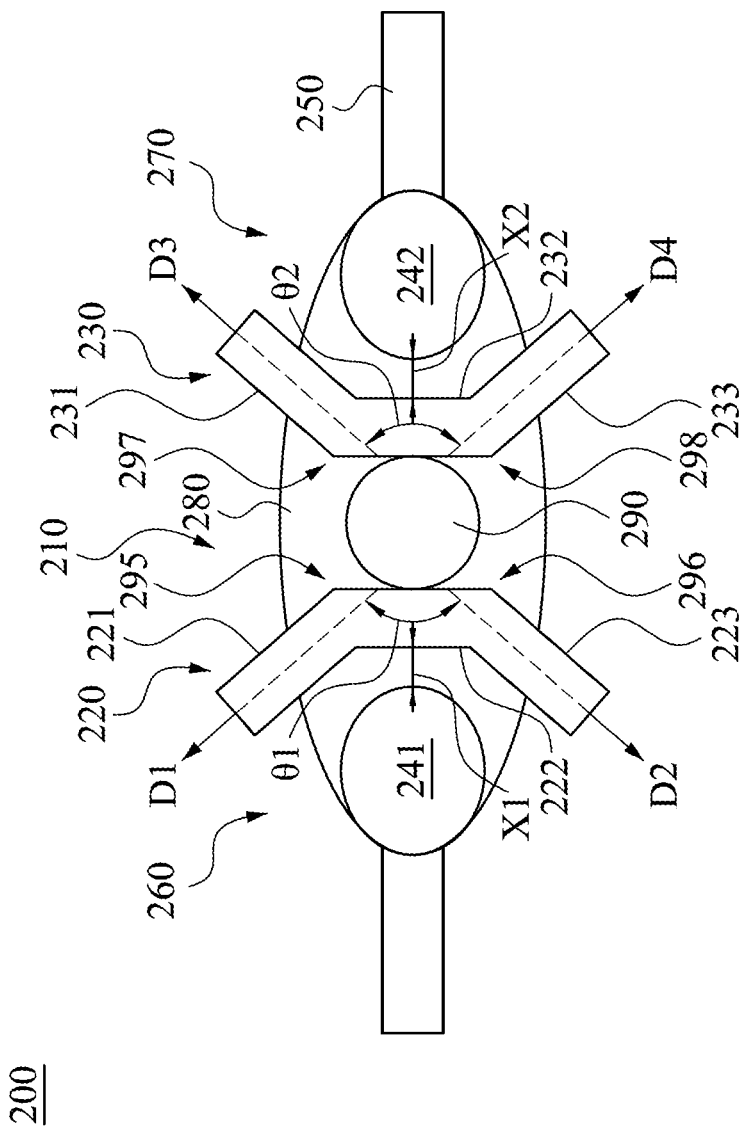
FIG. 2 illustrates a top view of a memory structure 200 according to an embodiment of the present invention.

FIG. 2 illustrates a top view of a memory structure 200 according to an embodiment of the present invention. The memory structure 200 includes a first memory cell 210, a first word line 220, a second word line 230, a first capacitor 241, a second capacitor 242, a bit line 250 and a bit line contact 290. The first memory cell 210 is an active area formed in a semiconductor substrate. FIG. 2 only shows a single memory cell 210 for a better understanding of the concepts of the present invention.

The first memory cell 210 can be oblong in a top view or a plane view as shown in FIG. 2, or can be substantially rectangular or have other suitable shapes in some embodiments of the present invention.

The first word line 220 includes a first portion 221, a second portion 222 and a third portion 223. In certain embodiments, the first portion 221 extends in a first direction D1 from an end of the second portion 222, whereas the third portion 223 extends in a second direction D2 from an opposite end of the second portion 222. The first direction D1 is different from the second direction D2. In some embodiments, the first direction D1 and the second direction D2 form an included angle θ1, which is less than 180°. In examples, the included angle θ1 ranges from 90 degrees to 170 degrees, for example, 100 degrees, 120 degrees, 140 degrees, and 160 degrees. If the included angle θ1 is greater than a certain value such as 170 degrees, the technical effect of the present invention is insignificant according to some embodiments. If the included angle θ1 is less than a certain value such as 90 degrees, the difficulties of the layout and/or manufacturing are unfavorably increased according to yet some embodiments. The first word line 220 bends inside the first memory cell 210. In other words, the first word line 220 has bending points 295 and 296 positioned in the first memory cell 210. In addition, the first word line 220 partially surrounds the first capacitor 241.

The second word line 230 includes a forth portion 231, a fifth portion 232 and a sixth portion 233. In certain embodiments, the forth portion 231 extends in a third direction D3 from an end of the fifth portion 232, while the sixth portion 233 extends in a fourth direction D4 from an opposite end of the fifth portion 232. The third direction D3 is different from the fourth direction D4. In some embodiments, the third direction D3 and the fourth direction D4 form an included angle θ2 of less than 180°. In examples, the included angle θ2 ranges from 90 degrees to 170 degrees, for example, 100 degrees, 120 degrees, 140 degrees, and 160 degrees. If the included angle θ2 is greater than a certain value such as 170 degrees, the technical effect of the present invention is insignificant according to some embodiments. If the included angle θ2 is less than a certain value such as 90 degrees, the difficulties of the layout and/or manufacturing are unfavorably increased. In some embodiments, the included angle θ2 is substantially equal to the included angle θ1, and the second word line 230 is mirror symmetric to the first word line 220. Similar to the first word line 220, the second word line 230 bends inside the first memory cell 210. In other words, the second word line 230 has bending points 297 and 298 in the first memory cell 210. In addition, the second word line 230 partially surrounds the second capacitor 242.

The first memory cell 210 includes a first cell region 260, a second cell region 270 and a digit region 280 disposed between the first cell region 260 and the second cell region 270. The first capacitor 241 is disposed in the first cell region 260 and the second capacitor 242 is disposed in the second cell region 270. The digit region 280 and the first cell region 260 are separated by the first word line 220, and the digit region 280 and the second cell region 270 are separated by the second word line 230. In some embodiments, the first capacitor 241 is completely located in the first cell region 260, and the second capacitor 242 is completely located in the second cell region 270. In yet some embodiments, the portions of the boundaries of the first and second capacitor 241, 242 constitute a portion of the boundary of the first memory cell 210.

In some embodiments, as shown in FIG. 2, the first capacitor 241 is spaced apart from the first word line 220 by a first distance X1 ranged from 18 nm to 25 nm. Similarly, the second capacitor 242 is spaced apart from the second word line 230 by a second distance X2 ranged from 18 nm to 25 nm. If the first distance X1 and/or the second distance X2 is less than 18 nm, the technical effect of the present invention is insignificant. On the other hand, if the first distance X1 and/or the second distance X2 is greater than 25 nm, the difficulties of the layout and/or manufacturing are unfavorably increased.

In certain embodiments, the bit line 250 extends through the first memory cell 210 in the top view (or in a plane view) of the memory structure 200. The bit line contact 290 is disposed in the digit region 270. In addition, the bit line contact 290 is electrically connected to the bit line 250.

Compared to the memory structure 100 in FIG. 1, the contact area between the first cell region 260 and the first capacitor 241 and the contact area between the second cell region 270 and the second capacitor 242 are greater than the contact area between the cell region 160 and the capacitor 140 in FIG. 1. Therefore, the resistance of the memory structure 200 in FIG. 2 is less than the resistance of the memory structure 100 in FIG. 1. Accordingly, the memory structure 200 illustrated in FIG. 2 provides a greater "on current", as compared with the memory structure 100 of FIG. 1.

Further, the electric field created by the first word line 220 and the second word line 230 in FIG. 2 is weaker than that created by the first word line 120 and the second word line 130 in FIG. 1. The weak electric field may improve the gate induced drain leakage (GIDL). In other words, the GIDL of the memory structure 200 in FIG. 2 is decreased.

In some embodiments, the widths of the first word line 220 and the second word line 230 are in a range of 5-50 nm, for example, 10 nm, 20 nm, 30 nm or 40 nm. In certain embodiments, a distance between the second portion 222 and the fifth portion 232 is less than a distance between the first portion 221 and the fourth portion 231 and/or a distance between the third portion 223 and the sixth portion 233.

Figure 3:
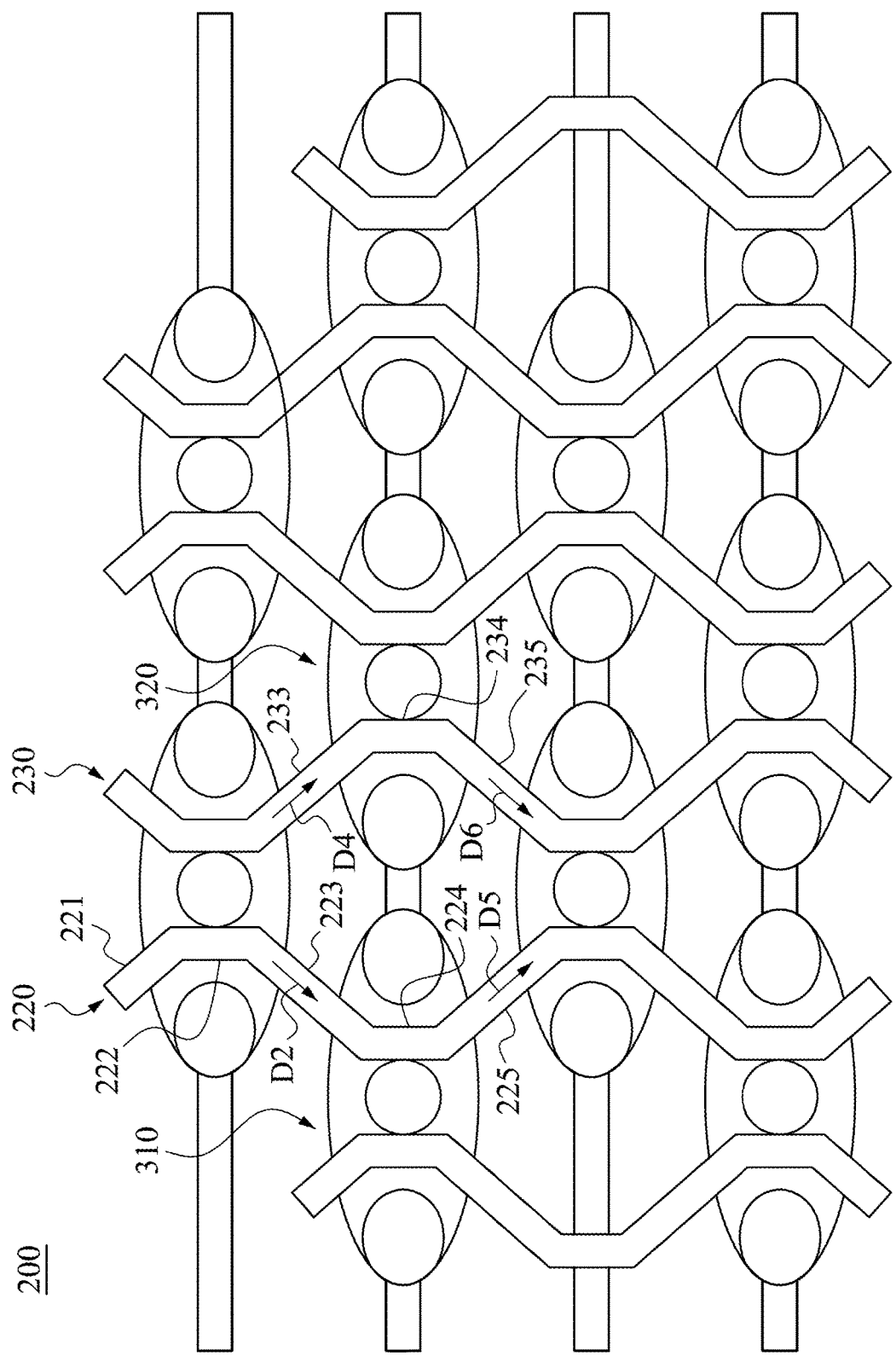
FIG. 3 illustrates a top view of the memory structure 200 according to an embodiment of the present invention.

Please refer to FIG. 3, which illustrates a top view of the memory structure 200 according to various embodiments of the present invention. To be more precisely, FIG. 3 illustrates a plurality of memory cells of the memory structure 200.

In certain embodiments of the present invention, the memory structure 200 further includes a second memory cell 310. The third portion 223 of the first word line 220 further extends to the second memory cell 310, and a part of the third portion 223 is disposed on the second memory cell 310. In some embodiments of the present invention, the memory structure 200 further includes a third memory cell 320. The sixth portion 233 of the second word line 230 further extends to the third memory cell 320, and a part of the sixth portion 233 is disposed on the third memory cell 320.

The first word line 220 further includes a seventh portion 224 and an eighth portion 225 in some embodiments of the present invention. The third portion 223 of the first word line 220 extends in the second direction D2 and is connected to an end of the seventh portion 224. The eighth portion 225 extends in a fifth direction D5 from an opposite end of the seventh portion 224. The fifth direction D5 is different from the second direction D2. In examples, the fifth direction D5 may be substantially parallel to the first direction D1. Specifically, the fifth direction D5 may be substantially opposite to the first direction D1. It is noted that the first word line 220 has a repeat unit of the combination of the first portion 221, the second portion 222, the third portion 223, the seventh portion 224 and the eighth portion 225.

The second word line 230 further includes a ninth portion 234 and a tenth portion 235 in some embodiments of the present invention. The sixth portion 233 of the second word line 230 extends in the direction D4 and is connected to an end of the ninth portion 234. The tenth portion 235 extends in a sixth direction D6 from an opposite end of the ninth portion 234. The sixth direction D6 is different from the fourth direction D4. In examples, the sixth direction D6 may be substantially parallel to the third direction D3. Specifically, the direction D6 may be substantially opposite to the third direction D3. Similar to the first word line 220, the second word line 230 has a repeat unit of the combination of the fourth portion 231, the fifth portion 232, the sixth portion 233, the ninth portion 234 and the tenth portion 235.

The configuration of the memory structure 200 significantly enlarges the contact area between the capacitors and the memory cells, which may effectively reduce the resistance of the memory structure 200. Further, the "on current" of the capacitors may be enhanced due to the large contact area. Besides, the novel shape of the word lines of the memory structure 200 may reduce the electric field near the capacitors, so that the leakage of the capacitors may be improved.

Figure 4:
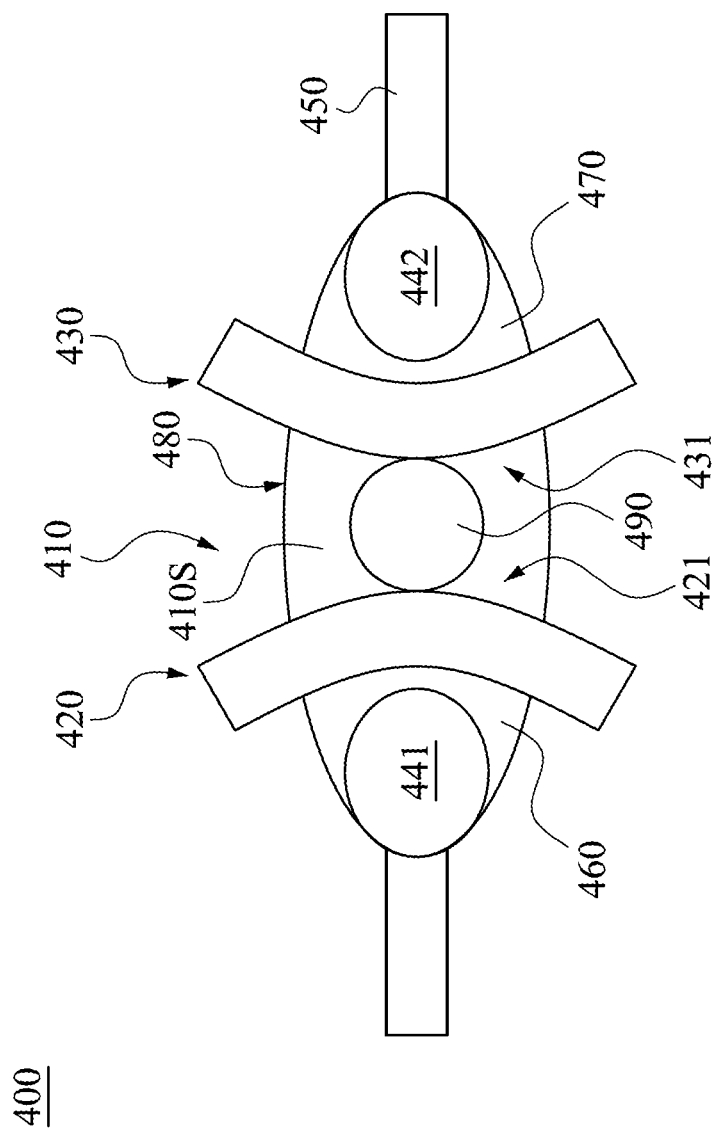
FIG. 4 illustrates a top view of a memory structure 400 according to an embodiment of the present invention.

FIG. 4 illustrates a top view of a memory structure 400 according to an embodiment of the present invention. The memory structure 400 includes a first memory cell 410, a first curved word line 420 and a second curved word line 430. For the purpose of simplicity, FIG. 4 only shows a single memory cell 410.

The first memory cell can be oblong in a top view or in a plane view as shown in FIG. 4, or can be substantially rectangular of have other suitable shapes in some embodiments of the present invention. The memory cell 410 includes a first cell region 460, a second cell region 470 and a digit region 480 disposed between the first cell region 460 and the second cell region 470. The digit region 480 and the first cell region 460 are separated by the first curved word line 420, and the digit region 480 and the second cell region 470 are separated by the second curved word line 430. In some embodiments, the memory structure 400 further includes a first capacitor 441 disposed in the first cell region 460 and a second capacitor 442 disposed in the second cell region 470. In some embodiments, the first capacitor 441 is completely located in the first cell region 460, and the second capacitor 442 is completely located in the second cell region 470. In yet some embodiments, the portions of the boundaries of the first and second capacitor 441, 442 constitute a portion of the boundary of the first memory cell 410.

In certain embodiments, the first memory cell 410 includes a principle surface 410S. The first curved word line 420 is positioned on the first memory cell 410, and the first curved word line 420 includes a first turning portion 421. On the other hand, the second curved word line 430 is positioned on the first memory cell. The second curved word line 430 includes a second turning portion 431, in which a minimal spacing between the first curved word line 420 and the second curved word line 430 is present between the first turning portion 421 and the second turning portion 431. Further, both the first turning portion 421 and the second turning portion 431 are aligned with and/or overlap the first memory cell 410 in a direction perpendicular to the principle surface.

In some embodiments, as shown in FIG. 4, the first capacitor 441 is spaced apart from the first curved word line 420 by a first distance ranged from 18 nm to 25 nm. Similarly, the second capacitor 442 is spaced apart from the second curved word line 430 by a second distance ranged from 18 nm to 25 nm.

The memory structure 400 further includes a bit line 450 and a bit line contact 490 disposed in the digit region 480 according to some embodiments. The bit line contact 490 is electrically connected to the bit line 450.

Figure 5:
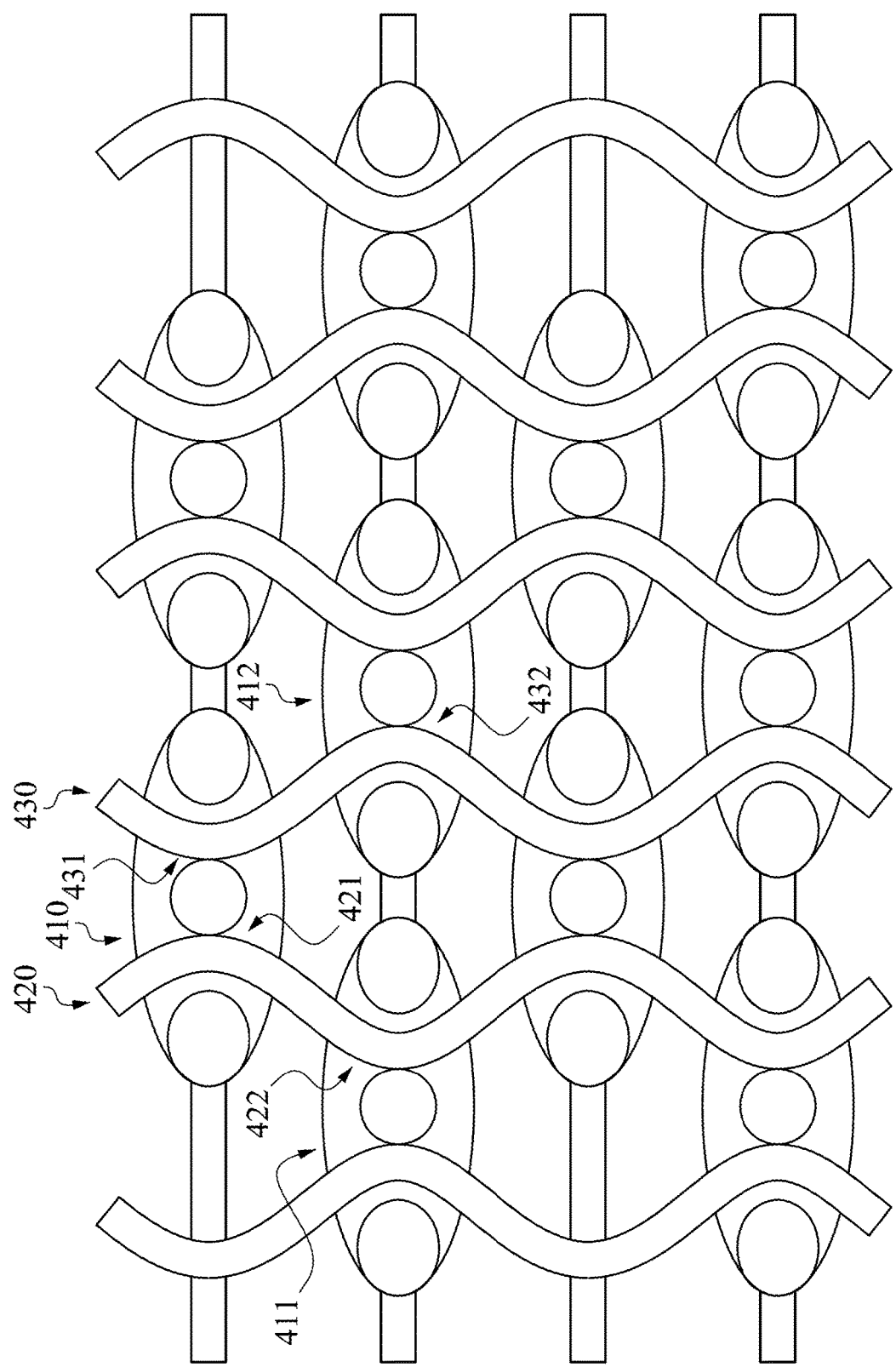
FIG. 5 illustrates a top view of the memory structure 400 according to an embodiment of the present invention.

Please refer to FIG. 5, which illustrates a top view of the memory structure 400 according to some embodiments of the present invention. To be more precisely, FIG. 5 illustrates a plurality of memory cells of the memory structure 400. In certain embodiments, the first curved word line 420 and the second curved word line 430 are wave curves. In other words, the shape of the first curved word line 420 and the second curved word line 430 is similar to the waveform of transverse waves.

The memory structure 400 further includes a second memory cell 411 in some embodiments. The second memory cell 411 is disposed near the first memory cell 410. The first curved word line 420 extends to the second memory cell 411, and a part of the first curved word line 420 is disposed on the second memory cell 411. The first curved word line 420 includes a third turning portion 422 disposed at the second memory cell 411.

The memory structure 400 further includes a third memory cell 412 in certain embodiments. The third memory cell 412 is disposed near the first memory cell 410 and the second memory cell 411. The second curved word line 430 extends to the third memory cell 412, and a part of the second curved word line 430 is disposed on the third memory cell 412. The second curved word line 430 further includes a fourth turning portion 432 disposed at the third memory cell 412.

Similar to the memory structure 200, the memory structure 400 significantly enlarges the contact area between the capacitors and the memory cells, which may effectively reduce the resistance of the memory structure 400. Furthermore, the disclosed word lines of the memory structure 400 may reduce the electric field near the capacitors, such that the leakage of the capacitors may be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A memory structure, comprising: a first memory cell, comprising:
   a first cell region;
   a second cell region;
   a digit region disposed between the first and second cell regions;
   a first capacitor disposed at the first cell region;
   a second capacitor disposed at the second cell region; and
   a bit line contact disposed at the digit region of the first memory cell;
   a first word line disposed on the first cell region of the first memory cell, wherein the first word line comprises a first portion, a second portion and a third portion, the first portion extends from an end of the second portion along a first direction and the third portion extends from an another end of the second portion along a second direction, and an angle between the first direction and the second direction is less than 180°, wherein the second portion is disposed between the first capacitor and the bit line contact; and
   a second word line disposed on the second region of the first memory cell, wherein the second word line comprises a forth portion, a fifth portion and a sixth portion, the forth portion extends from an end of the fifth portion along a third direction and the sixth portion extends from an another end of the fifth portion along a forth direction, and an angle between the third direction and the forth direction is less than 180°, wherein the fifth portion is disposed between the second capacitor and the bit line contact, wherein a distance between the second portion and the fifth portion is less than a distance between the first portion and the forth portion and a distance between the third portion and the sixth portion.

2. The memory structure of claim 1, further comprising a second memory cell, wherein the third portion extends to the second memory cell and a part of the third portion is disposed on the second memory cell.

3. The memory structure of claim 1, further comprising a third memory cell, wherein the sixth portion extends to the third memory cell and a part of the sixth portion is disposed on the third memory cell.

4. The memory structure of claim 1, further comprising a bit line extending through the first memory cell.

5. The memory structure of claim 4, wherein the bit line contact is electrically connected with the bit line.

6. The memory structure of claim 1, wherein the digit region and the first cell region are separated by the first word line, and the digit region and the second cell region are separated by the second word line.

7. The memory structure of claim 1, wherein the distance between the second portion and the fifth portion is 5-50 nm.

8. The memory structure of claim 1, wherein a bending point of the first word line and a bending point of the second word line are disposed in the first memory cell.

9. The memory structure of claim 1, wherein a width of the first word line or the second word line is 5-50 nm.

10. A memory structure, comprising:
    a first memory cell having a principle surface, wherein the first memory cell comprises:
      a first cell region;
      a second cell region;
      a digit region between the first and second cell regions;
      a first capacitor disposed in the first cell region;
      a second capacitor disposed in the second cell region; and
      a bit line contact disposed in the digit region;
    a first curved word line on the first cell region of the first memory cell, and the first curved word line comprises a first turning portion, wherein the first turning portion is disposed between the first capacitor and the bit line contact; and
    a second curved word line disposed on the second cell region of the first memory cell, and the second curved word line comprises a second turning portion, wherein the second turning portion is disposed between the second capacitor and the bit line contact,
    wherein a minimal spacing between the first and the second curved word lines is present between the first and the second turning portions, and both the first and the second turning portions are aligned with the first memory cell in a direction perpendicular to the principle surface.

11. The memory structure of claim 10, further comprising a second memory cell, wherein the first curved word line extends to the second memory cell and a part of the first curved word line is disposed on the second memory cell.

12. The memory structure of claim 11, wherein the first curved word line has a third turning point disposed at the second memory cell.

13. The memory structure of claim 10, further comprising a third memory cell, wherein the second curved word line extends to the third memory cell and a part of the second curved word line is disposed on the third memory cell.

14. The memory structure of claim 10, further comprising a bit line, wherein the bit line extends through the first memory cell.

15. The memory structure of claim 14, wherein the bit line contact is electrically connected with the bit line.

* * * * *